US010663132B2

(12) United States Patent
Ano et al.

(10) Patent No.: US 10,663,132 B2
(45) Date of Patent: May 26, 2020

(54) VEHICLE LAMP

(71) Applicant: STANLEY ELECTRIC CO., LTD., Tokyo (JP)

(72) Inventors: Koichiro Ano, Tokyo (JP); Hiroyuki Chikama, Tokyo (JP); Kai Ikeda, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/107,508

(22) Filed: Aug. 21, 2018

(65) Prior Publication Data

US 2019/0063705 A1 Feb. 28, 2019

(30) Foreign Application Priority Data

Aug. 23, 2017 (JP) ................................ 2017-160186

(51) Int. Cl.
*F21S 41/155* (2018.01)
*F21S 41/19* (2018.01)
(Continued)

(52) U.S. Cl.
CPC ........... *F21S 41/155* (2018.01); *F21S 41/192* (2018.01); *F21S 43/145* (2018.01); *F21S 43/195* (2018.01);
(Continued)

(58) Field of Classification Search
CPC ...... F21S 41/155; F21S 41/192; F21S 43/145; F21S 43/195; F21V 17/06; H01L 51/52
See application file for complete search history.

(56) References Cited

U.S. PATENT DOCUMENTS

| | | | | |
|---|---|---|---|---|
| 2010/0237774 | A1 | 9/2010 | Yamazaki et al. | |
| 2016/0290586 | A1* | 10/2016 | Shido .................... | F21S 43/145 |
| 2017/0164433 | A1 | 6/2017 | Matsuda | |

FOREIGN PATENT DOCUMENTS

| | | | |
|---|---|---|---|
| EP | 2719946 | A1 | 4/2014 |
| EP | 2886936 | A1 | 6/2015 |

(Continued)

OTHER PUBLICATIONS

Extended European Search Report for the related European Patent Application No. 18190246.1 dated Jan. 4, 2019.

*Primary Examiner* — Anh T Mai
*Assistant Examiner* — Nathaniel J Lee
(74) *Attorney, Agent, or Firm* — Kenealy Vaidya LLP

(57) ABSTRACT

Provided is a vehicle lamp which enables work for connecting an organic EL panel and a power feeding section to be omitted. A vehicle lamp 10 includes: a lamp unit 20; a mounting section 70 to which the lamp unit 20 is detachably mounted; and first fixing means (a first fixing section) which fixes the lamp unit 20 detachably mounted to the mounting section 70, and the mounting section 70, wherein the lamp unit 20 includes: an organic EL panel 40 including a front surface 40*a* with a light-emitting surface 40*a*1, and a rear surface 40*b* on an opposite side to the front surface 40*a*; a first electrode 54 electrically connected to the organic EL panel 40; and a first bracket 30 which holds the organic EL panel 40 and the first electrode 54, and the mounting section 70 includes a second electrode 82 to which the first electrode 54 of the lamp unit 20 fixed by the first fixing means (first fixing section) is to be electrically connected.

9 Claims, 8 Drawing Sheets

(51) Int. Cl.

| | |
|---|---|
| ***F21S 43/19*** | (2018.01) |
| ***F21S 43/145*** | (2018.01) |
| ***F21V 17/06*** | (2006.01) |
| ***H01L 51/52*** | (2006.01) |
| *F21Y 115/15* | (2016.01) |

(52) U.S. Cl.
CPC .......... *F21V 17/06* (2013.01); *H01L 51/5203* (2013.01); *F21Y 2115/15* (2016.08)

(56) References Cited

FOREIGN PATENT DOCUMENTS

| | | | |
|---|---|---|---|
| EP | 3026761 | A1 | 6/2016 |
| EP | 3088797 | A1 | 11/2016 |

* cited by examiner

VEHICLE LAMP

CROSS-REFERENCE TO RELATED APPLICATION

This application is based upon and claims the benefit of priority of the prior Japanese Patent Application No. 2017-160186, filed on Aug. 23, 2017, the entire contents of which are incorporated herein by reference.

FIELD

The present invention relates to a vehicle lamp and, in particular, to a vehicle lamp using an organic EL panel.

BACKGROUND

Conventionally, vehicle lamps using an organic EL panel including a front surface with a light-emitting surface, and a rear surface on an opposite side to the front surface are proposed (for example, refer to European Patent Application Publication No. 2886936 (Specification)).

SUMMARY

However, with the vehicle lamp described in European Patent No. 2886936, there is a problem that work for connecting an organic EL panel and a power feeding section using, for example, a connector or a feeder cable needs to be performed, resulting in an increase in assembly man-hours which may cause cost to increase.

The present invention has been made in consideration of the circumstances described above and an object thereof is to provide a vehicle lamp which enables work for connecting an organic EL panel and a power feeding section to be omitted.

In order to achieve the object described above, an aspect of the present invention is a vehicle lamp including: a lamp unit; a mounting section to which the lamp unit is detachably mounted; and first fixing means (a first fixing section) which fixes the lamp unit detachably mounted to the mounting section, and the mounting section, wherein the lamp unit includes: an organic EL panel including a front surface with a light-emitting surface, and a rear surface on an opposite side to the front surface; a first electrode electrically connected to the organic EL panel; and a first bracket which holds the organic EL panel and the first electrode, and the mounting section includes a second electrode to which the first electrode of the lamp unit fixed by the first fixing means (first fixing section) is to be electrically connected.

According to this aspect, a vehicle lamp which enables work for connecting an organic EL panel and a power feeding section to be omitted can be provided.

This is attributable to the fact that, since the mounting section includes the second electrode to which the first electrode of the lamp unit fixed to the mounting section is to be electrically connected, the organic EL panel (the first electrode) and the second electrode (the power feeding section) can be electrically connected by simply (at the same time as) fixing the lamp unit (the organic EL panel) to the mounting section without having to perform work for connecting the organic EL panel (the first electrode) and the second electrode (the power feeding section).

In addition, in a preferred aspect of the invention described above, the lamp unit further includes a resistor to which the organic EL panel and the first electrode are electrically connected, and a substrate on which the first electrode is mounted, and the first bracket includes a first holding section which holds the organic EL panel, and a second holding section which holds the substrate.

According to this aspect, the organic EL panel can be caused to emit light at a constant brightness.

Furthermore, a preferred aspect of the invention described above includes the first bracket arranged on the rear surface of the organic EL panel, a second bracket arranged on the front surface of the organic EL panel, and second fixing means (a second fixing section) which fixes the first bracket and the second bracket in a state where the organic EL panel is sandwiched between the first bracket and the second bracket.

According to this aspect, the organic EL panel can be held in a protected state.

In addition, in a preferred aspect of the invention described above, the first holding section extends in a first direction, and the second holding section extends in a second direction which intersects with the first direction.

According to this aspect, dimensions in the first direction of the first bracket and the vehicle lamp using the first bracket can be reduced.

Furthermore, in a preferred aspect of the invention described above, the second holding section is provided with a substrate housing section which houses the substrate, and the second bracket is provided with a substrate pressing section which presses the substrate housed in the substrate housing section in a state where the first bracket and the second bracket are fixed by the second fixing means (second fixing section).

According to this aspect, by fixing the first bracket and the second bracket, the organic EL panel and the substrate can be fixed at the same time.

DESCRIPTION OF EMBODIMENTS

Hereinafter, a vehicle lamp 10 representing a first embodiment of the present invention will be described with reference to the accompanying drawings. Corresponding components in the respective drawings will be denoted by same reference signs and redundant descriptions thereof will be omitted.

Figure 1:
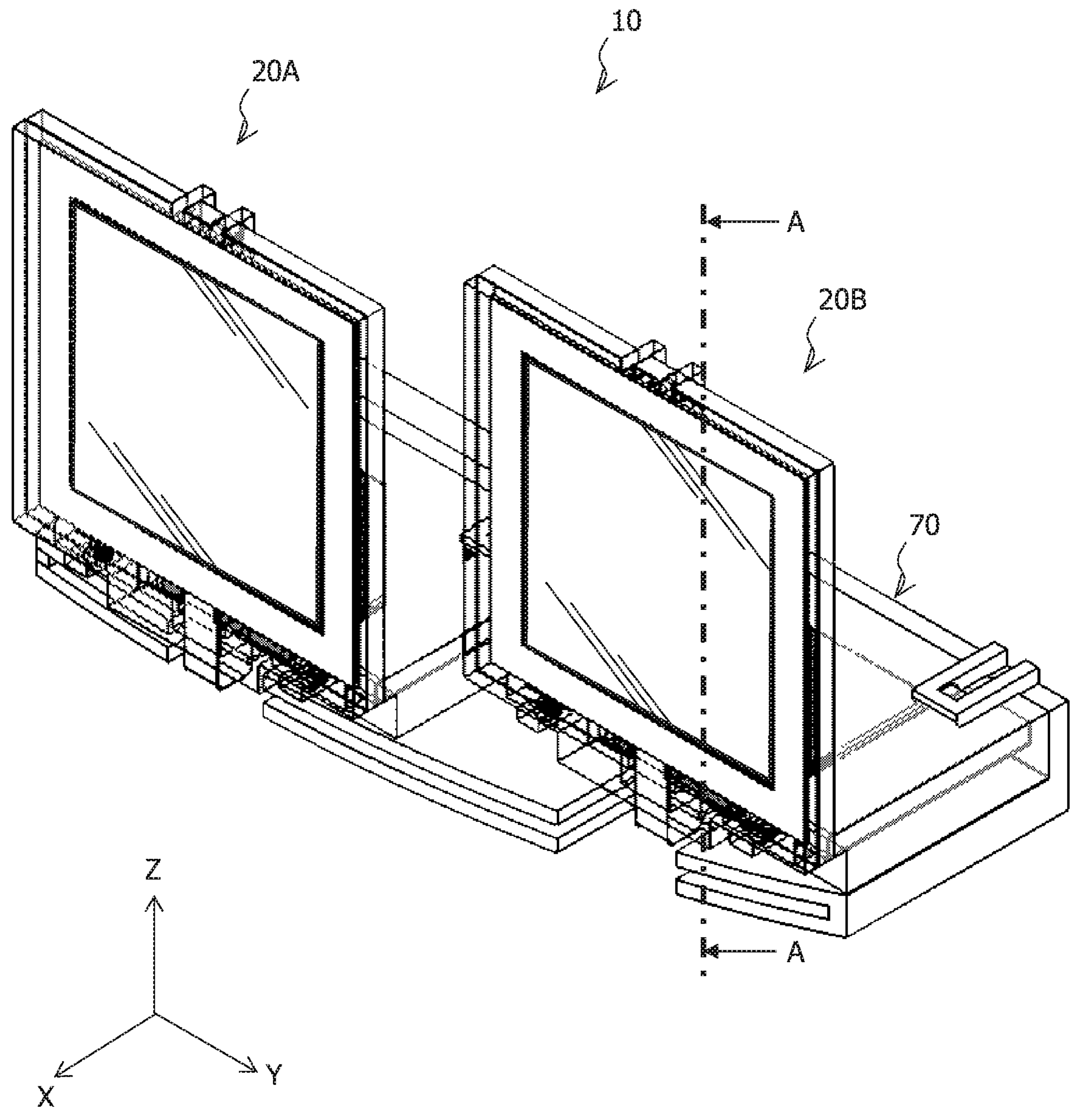
FIG. 1 is a perspective view of a vehicle lamp 10.

FIG. 1 is a perspective view of the vehicle lamp 10.

The vehicle lamp 10 illustrated in FIG. 1 is, for example, a tail lamp mounted on left and right sides of a rear end part of a vehicle (not illustrated). X, Y, and Z axes will now be defined for the sake of convenience. The X axis extends in a front-back direction of the vehicle, the Y axis extends in a width direction of the vehicle, and the Z axis extends in a vertical direction.

Figure 2:
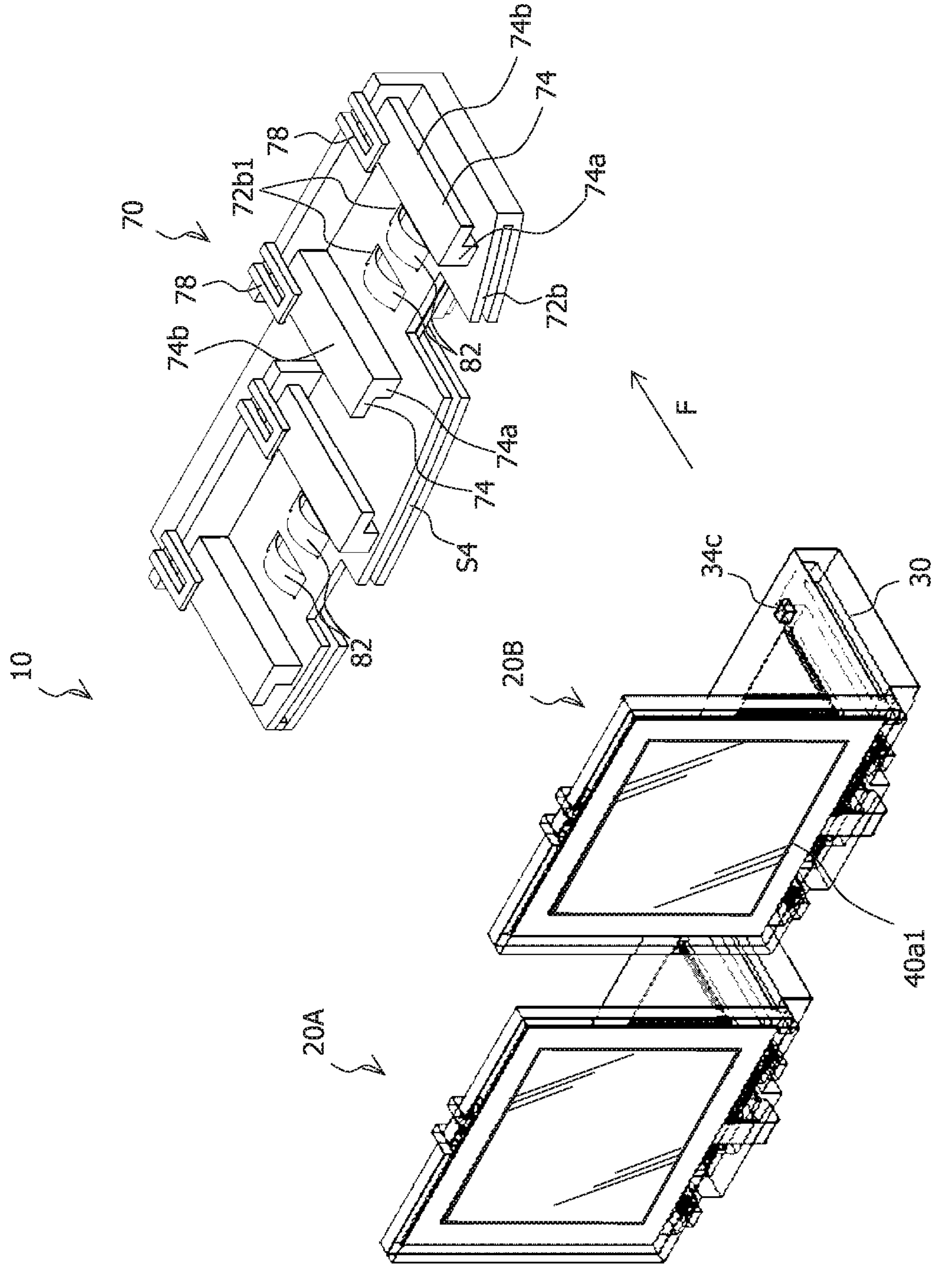
FIG. 2 is an exploded perspective view of the vehicle lamp 10.

FIG. 2 is an exploded perspective view of the vehicle lamp 10.

As illustrated in FIG. 2, the vehicle lamp 10 according to the present embodiment includes lamp units 20A and 20B and a housing 70. The housing 70 represents an example of the mounting section according to the present invention. Since the lamp units 20A and 20B share a common configuration, hereinafter, the term "lamp unit 20" will be used unless there is a need to distinguish the lamp units 20A and 20B from each other. In addition, the number of the lamp units 20 is not particularly limited and only one or three or more lamp units 20 may be provided.

Figure 3:
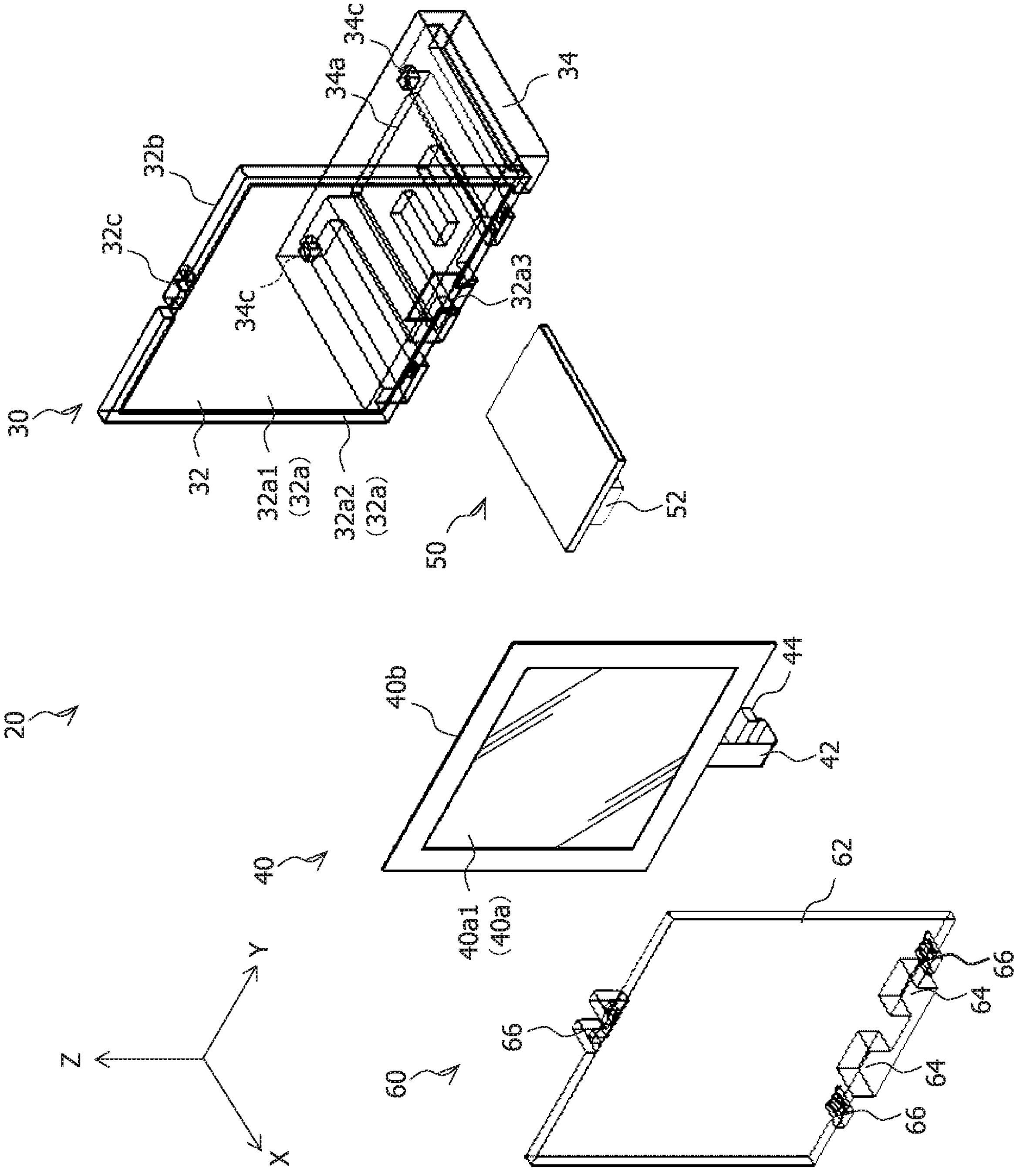
FIG. 3 is an exploded perspective view of a lamp unit 20.
Figure 4:
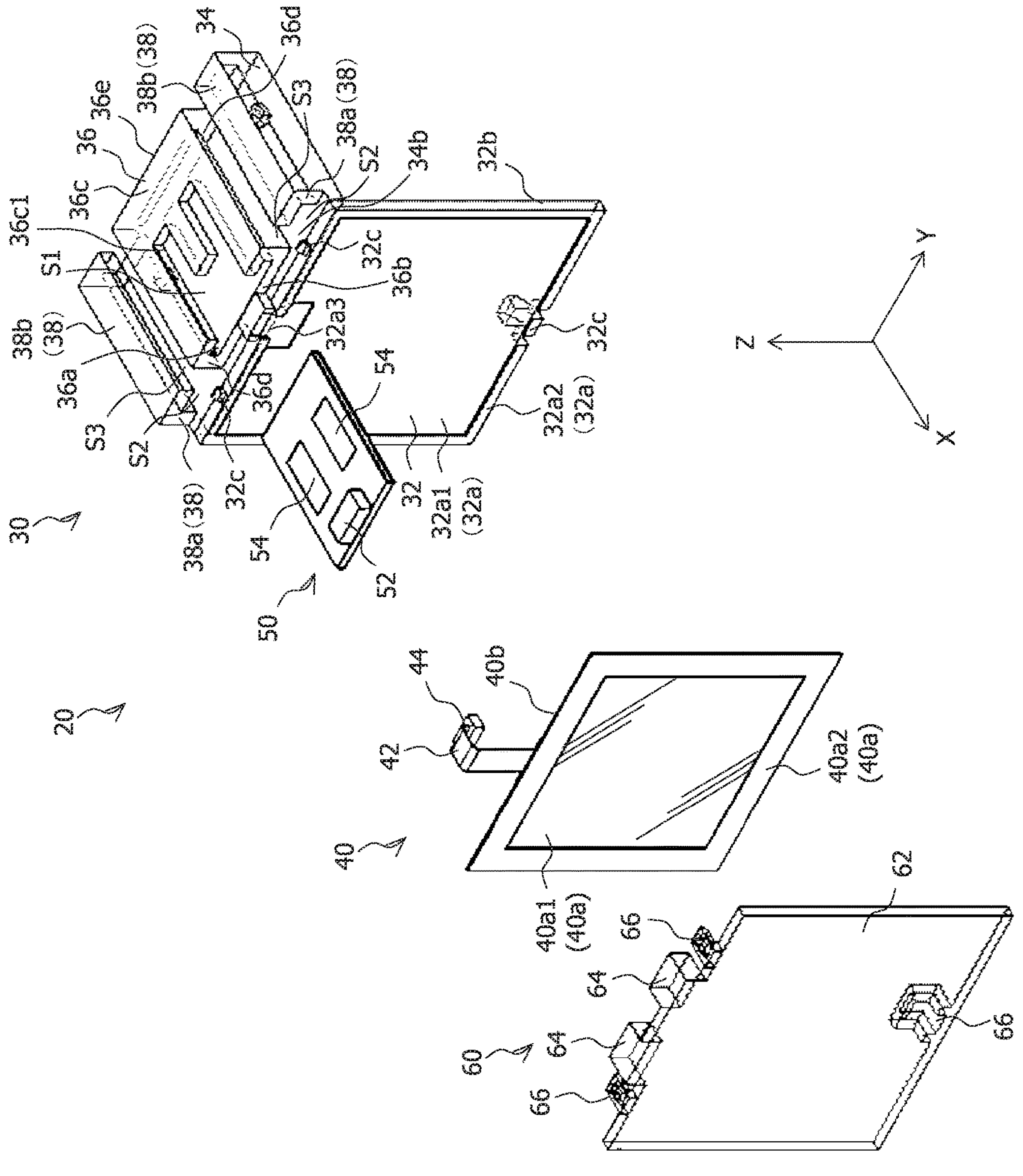
FIG. 4 is an exploded perspective view of the lamp unit 20.

FIGS. 3 and 4 are exploded perspective views of the lamp unit 20. FIG. 5 are perspective views of the lamp unit 20. FIG. 6 is a sectional view taken along A-A in FIG. 1.

As illustrated in FIGS. 3 and 4, the lamp unit 20 includes a first bracket 30, an organic EL panel 40, a sub-circuit board 50, and a second bracket 60.

The organic EL panel 40 is, for example, a glass substrate-type organic EL panel including a front surface 40*a*, a rear surface 40*b* on an opposite side to the front surface 40*a*, and a glass plate (not illustrated) covering at least the front surface 40*a*. Alternatively, the organic EL panel 40 may be a flexible organic EL panel which does not include a glass plate and which has flexibility.

The front surface 40*a* of the organic EL panel 40 includes a light-emitting surface 40*a*1 which emits red light and a non-light emitting area 40*a*2 which encloses the light-emitting surface 40*a*1. An electrode for supplying power to drive the organic EL panel 40 is provided in the non-light emitting area 40*a*2. A feeder cable 42 is electrically connected to the electrode. Moreover, the non-light emitting area 40*a*2 may enclose an entire circumference of the light-emitting surface 40*a*1 or may enclose a part of the light-emitting surface 40*a*1.

The first bracket 30 is arranged on a side of the rear surface 40*b* of the organic EL panel 40. The first bracket 30 is a member with an L-shaped cross section on an XZ plane and includes a first holding section (hereinafter, referred to as an organic EL panel holding section 32) which constitutes a vertical portion of the L shape and a second holding section (hereinafter, referred to as a substrate holding section 34) which constitutes a horizontal portion of the L shape.

As described above, since the organic EL panel holding section 32 extends in the Z direction and the substrate holding section 34 extends in the X direction, dimensions in a vertical direction (Z direction) of the first bracket 30 and the vehicle lamp 10 using the first bracket 30 can be reduced.

The organic EL panel holding section 32 is a rectangular plate-like part including a front surface 32*a*, and a rear surface 32*b* on an opposite side to the front surface 32*a*, and is arranged parallel to the YZ plane.

The front surface 32*a* of the organic EL panel holding section 32 includes a rectangular area 32*a*1 in which the organic EL panel 40 is arranged and a protrusion 32*a*2 provided so as to enclose the organic EL panel 40 arranged in the rectangular area 32*a*1. The protrusion 32*a*2 restricts a movement of the organic EL panel 40 in up-down and left-right directions with respect to the first bracket 30 and the second bracket 60.

The protrusion 32*a*2 is provided with a notched part 32*a*3 in which a feeder cable 42 of the organic EL panel 40 is arranged.

In order to fix the second bracket 60 to the first bracket 30, the organic EL panel holding section 32 is provided with a claw part 32*c* with which a hook part 66 provided in the second bracket 60 engages. The claw part 32*c* is respectively provided in an upper end part of the organic EL panel holding section 32 (one location: refer to FIGS. 3 and 4) and in a lower end part of the organic EL panel holding section 32 (two locations: refer to FIG. 4).

The substrate holding section 34 is a rectangular plate-like part including an upper surface 34*a* (refer to FIG. 3) and a lower surface 34*b* (refer to FIG. 4) on an opposite side to the upper surface 34*a* and is arranged parallel to the XY plane. A front-side end part of the substrate holding section 34 is coupled to a lower end part of the organic EL panel holding section 32.

As illustrated in FIG. 4, a substrate housing section 36 is provided on the lower surface 34*b* of the substrate holding section 34.

The substrate housing section 36 includes a substrate housing space S1. The substrate housing space S1 is a space enclosed by an upper surface part 36*b* and a lower surface part 36*c* arranged parallel to the XY plane, side surface parts 36*d* arranged parallel to the XZ plane, and a rear surface part 36*e* arranged parallel to the YZ plane, and an opening 36*a* communicated with the space is provided on a front side.

A connector 52 into which a plug 44 provided in the feeder cable 42 of the organic EL panel 40 is inserted, a first electrode 54, and a resistor (not illustrated) to which the connector 52 (the organic EL panel 40) and the first electrode 54 are electrically connected are mounted on the sub-circuit board 50.

Next, a technical significance of the resistor mounted on the sub-circuit board 50 will be described.

In the vehicle lamp 10, the organic EL panel 40 is needed to emit light at a constant brightness (luminance).

However, due to manufacturing variability, the organic EL panel 40 does not always emit light at a constant brightness even if constant power is supplied thereto.

In consideration thereof, the sub-circuit board 50 is mounted with a resistor with a resistance value designed so that the organic EL panel 40 emits light at a constant brightness when constant power is supplied thereto. Accordingly, the organic EL panel 40 can be caused to emit light at a constant brightness.

Figure 5A:
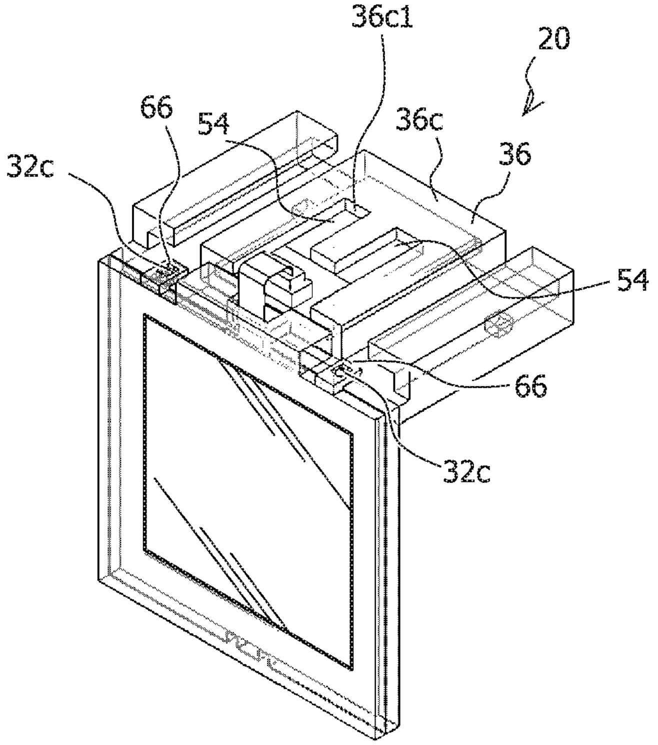
FIGS. 5A and 5B are perspective views of the lamp unit 20.
Figure 5B:
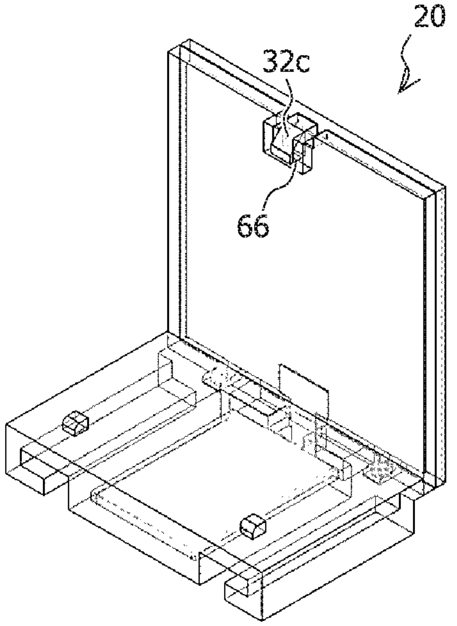
Figure 6:
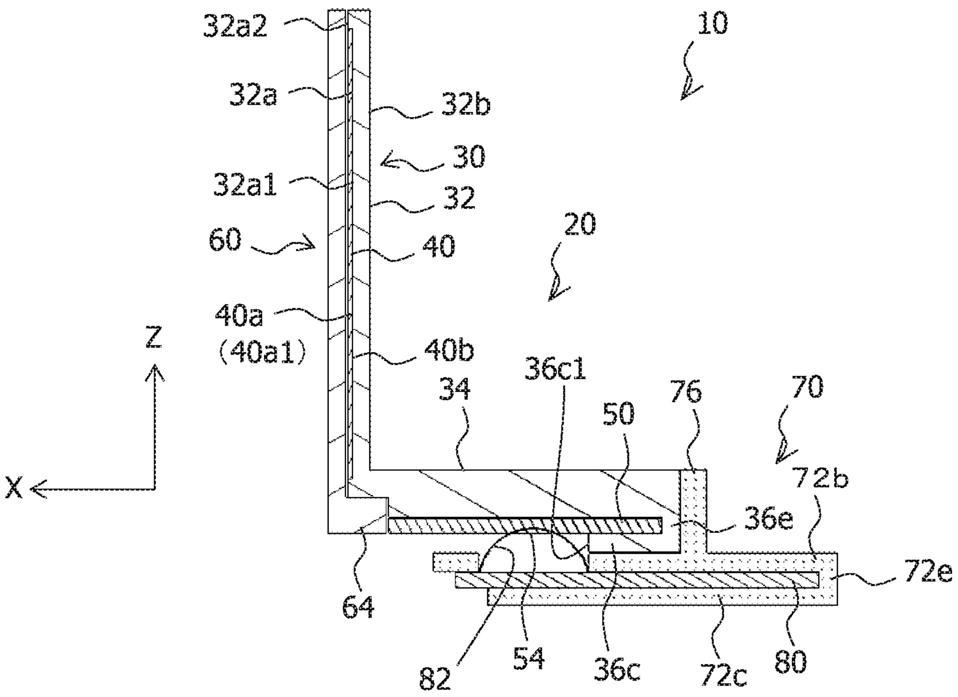
FIG. 6 is a sectional view taken along A-A in FIG. 1.

The sub-circuit board 50 is inserted into the substrate housing section 36 (the substrate housing space S1) via the opening 36*a* provided on the front side and, as illustrated in FIGS. 5A and 5B, housed in the substrate housing section 36 (the substrate housing space S1) in a state where the first electrode 54 is exposed from a notched part 36*c*1 provided in the lower surface part 36*c* of the substrate housing section 36.

In addition, as illustrated in FIG. 6, the sub-circuit board 50 is fixed to (held by) the substrate holding section 34 (the substrate housing section 36) as a front-side end part of the sub-circuit board 50 is pressed by a substrate pressing section 64 provided in the second bracket 60.

As illustrated in FIG. 4, a guide section 38 is respectively provided on both sides in the Y direction of the lower surface 34*b* of the substrate holding section 34 and the substrate housing section 36.

The guide section 38 includes a first guide section 38*a* extending in the X direction and a second guide section 38*b* extending inward (Y direction) from a tip part (an upper end part in FIG. 4) of the first guide section 38*a*.

A space S2 into which a second flange part 74*b* (refer to FIG. 7) provided in the housing 70 is inserted is formed between the first guide section 38*a* and the side surface part 36*d* of the substrate housing section 36.

A space S3 into which a first flange part 74*a* (refer to FIG. 7) provided in the housing 70 is inserted is formed between the second guide section 38*b* and the side surface part 36*d* of the substrate housing section 36.

As illustrated in FIG. 3, in order to fix the lamp unit 20 to the housing 70, the substrate holding section 34 is provided with a claw part 34*c* with which a hook part 78 (refer to FIG. 7) provided in the housing 70 engages. The claw part 34*c* is provided on, for example, an upper surface (two locations) of the substrate holding section 34.

The first bracket 30 in the configuration described above can be formed by injection molding of a transparent resin such as acrylic or polycarbonate.

As illustrated in FIGS. 3 and 4, the second bracket 60 is arranged on a side of the front surface 40*a* of the organic EL panel 40.

The second bracket 60 includes a transparent plate 62, the substrate pressing section 64, and the hook part 66.

The transparent plate 62 is a rectangular plate-like transparent plate through which light emitted by the light-emitting surface 40*a*1 of the organic EL panel 40 passes and is arranged parallel to the YZ plane. A size of the transparent plate 62 is the same (or approximately the same) as that of the light-emitting surface 40*a*1 of the organic EL panel 40. As the transparent plate 62, a transparent plate equipped with a function for filtering out UV rays passing through the transparent plate 62 such as a transparent plate molded using acrylic, polycarbonate, or other synthetic resins with a UV-filtering function or a transparent plate to which a UV coating or a UV protection film has been applied is desirably used. Accordingly, resistance to ultraviolet radiation (UV resistance) of the organic EL panel can be improved.

The transparent plate 62 is provided with the substrate pressing section 64 for pressing a front-side end part of the sub-circuit board 50 housed in the substrate housing section 36 (the substrate housing space S1). The substrate pressing section 64 is provided in, for example, a lower end part (two locations) of the transparent plate 62.

In order to fix the second bracket 60 to the first bracket 30, the transparent plate 62 is provided with the hook part 66 with which the claw part 32*c* provided in the first bracket 30 (the organic EL panel holding section 32) engages. The hook part 66 is respectively provided in, for example, an upper end part (one location) of the transparent plate 62 and a lower end part (two locations) of the transparent plate 62.

By causing the plurality of hook parts 66 provided on the transparent plate 62 to engage with the plurality of claw parts 32*c* provided in the first bracket 30 as illustrated in FIGS. 5A and 5B, the first bracket 30 and the second bracket 60 can be fixed in a state where the organic EL panel 40 is sandwiched between the first bracket 30 and the second bracket 60 as illustrated in FIG. 6. Accordingly, the organic EL panel 40 can be held in a protected state. The plurality of claw parts 32*c* and the plurality of hook parts 66 represent an example of the second fixing means according to the present invention.

In doing so, since the hook part 66 provided in the upper end part of the transparent plate 62 is arranged on the rear surface of the first bracket 30 (the organic EL panel holding section 32) (refer to FIG. 5B), the hook part 66 provided in the upper end part of the transparent plate 62 is prevented from being visible from the front.

In addition, by causing the plurality of hook parts 66 provided on the transparent plate 62 to engage with the plurality of claw parts 32*c* provided in the first bracket 30 as illustrated in FIGS. 5A and 5B, the first bracket 30 and the second bracket 60 can be fixed in a state where the sub-circuit board 50 is sandwiched between the substrate pressing section 64 provided on the transparent plate 62 and the rear surface part 36*e* of the substrate housing section 36 as illustrated in FIG. 6.

In this manner, by fixing the first bracket 30 and the second bracket 60, the organic EL panel 40 and the sub-circuit board 50 can be fixed (sandwiched) at the same time.

Figure 7:
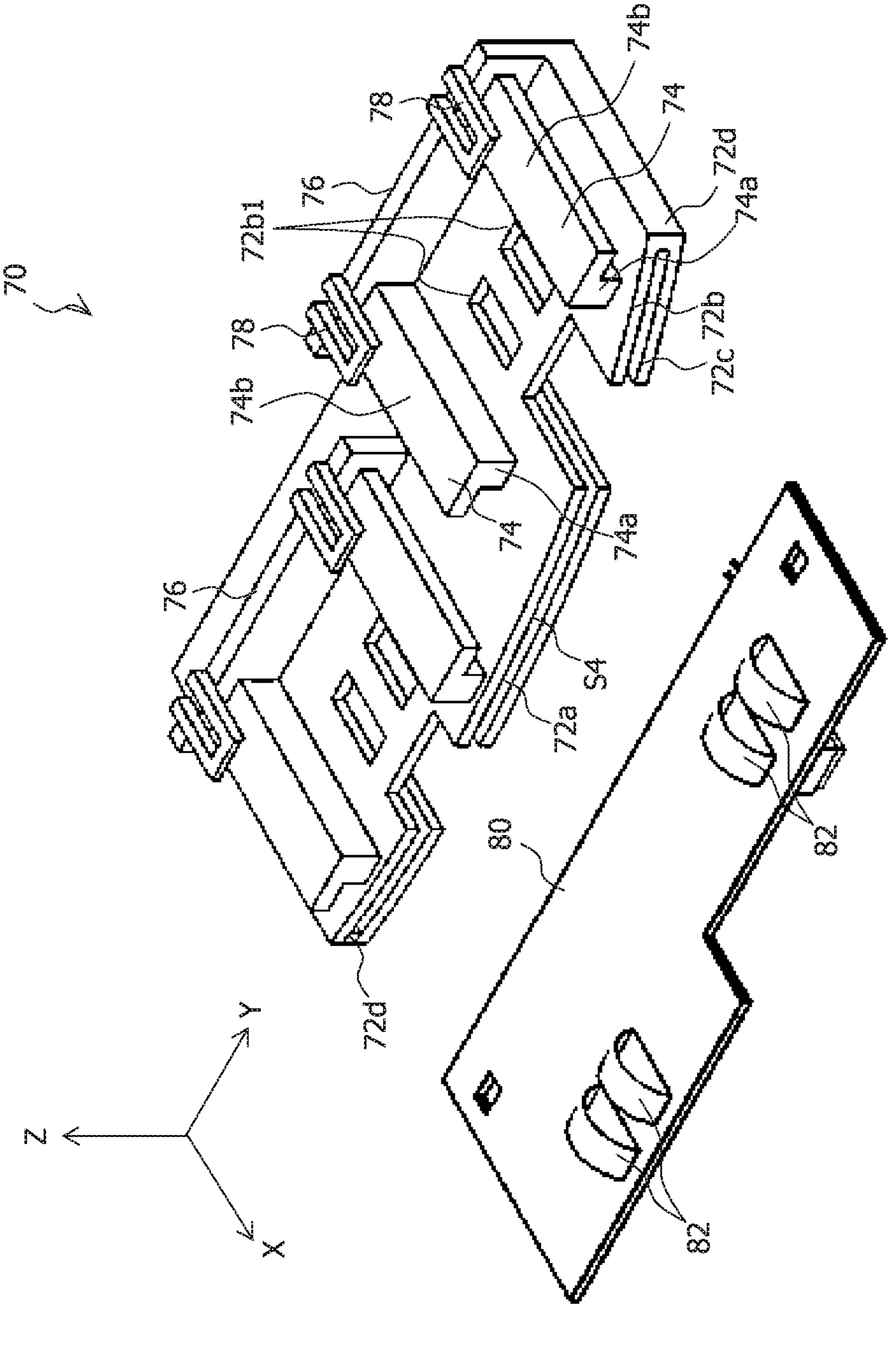
FIG. 7 is a perspective view of a housing.

FIG. 7 is a perspective view of a housing.

As illustrated in FIG. 7, the housing 70 includes a substrate housing space S4. The substrate housing space S4 is a space enclosed by an upper surface part 72*b* and a lower surface part 72*c* arranged parallel to the XY plane, side surface parts 72*d* arranged parallel to the XZ plane, and a rear surface part 72*e* (refer to FIG. 6) arranged parallel to the YZ plane, and an opening 72*a* communicated with the space is provided on a front side.

A second electrode 82 to be electrically connected to the first electrode 54 mounted on the sub-circuit board 50 and the like are mounted on a main circuit board 80. The second electrode 82 is a spring electrode. The second electrode 82 may be an arch-type spring electrode, a leaf spring-type spring electrode, or other spring electrodes.

The main circuit board 80 is inserted into the substrate housing space S4 via the opening 72*a* provided on the front side and, as illustrated in FIG. 2, housed in the substrate housing space S4 in a state where the second electrode 82 protrudes from an opening 72*b*1 provided in the upper surface part 72*b* of the housing 70.

The main circuit board 80 is fixed to (held by) the housing 70 (the substrate housing space S4) due to the second electrode 82 protruding from the opening 72*b*1.

The main circuit board 80 supplies constant power to the sub-circuit board 50 via the second electrode 82 and the first electrode 54 electrically connected to the second electrode 82. For example, the main circuit board 80 adjusts power supplied from a power supply (not illustrated) to constant power in accordance with the number of lamp units 20 or a lighting pattern thereof, and supplies the adjusted constant power to the sub-circuit board 50 via the second electrode 82 and the first electrode 54 electrically connected to the second electrode 82. In this case, the main circuit board 80 (the second electrode 82) functions as the power feeding section.

As illustrated in FIG. 7, a flange part 74 is respectively provided on both sides in the Y direction of an upper surface and the opening 72*b*1 of the upper surface part 72*b* of the housing 70.

The flange part 74 includes a first flange part 74*a* extending in the X direction and a second flange part 74*b* extending outward (Y direction) from a tip part (an upper end part in FIG. 7) of the first flange part 74*a*.

The first flange part 74*a* is inserted into the space S3 (refer to FIG. 3) formed between the second guide section 38*b* of the first bracket 30 and the side surface part 36*d* of the substrate housing section 36.

The second flange part 74*b* is inserted into the space S2 (refer to FIG. 4) formed between the first guide section 38*a* of the first bracket 30 and the side surface part 36*d* of the substrate housing section 36.

In addition, a wall part 76 with which the lamp unit 20 (the first bracket 30) comes into contact is provided in the upper surface part 72*b* of the housing 70. In order to fix the lamp unit 20 to the housing 70, the wall part 76 is provided with the hook part 78 with which the claw part 34*c* provided in the first bracket 30 engages. The hook part 78 is provided at, for example, two locations of the wall part 76.

The housing 70 in the configuration described above can be formed by injection molding using a transparent resin such as acrylic or polycarbonate.

The lamp unit 20 is mounted to the housing 70 as described below.

First, the lamp unit 20 is moved in a direction of an arrow F illustrated in FIG. 2 to insert the flange parts 74 (the first flange part 74*a* and the second flange part 74*b*) provided in the housing 70 into the spaces S2 and S3 (refer to FIG. 4) between the guide section 38 and the side surface part 36*d* of the substrate housing section 36 provided in the lamp unit 20.

Next, the lamp unit 20 is moved (slidingly moved) in the direction of the arrow F along the guide sections 38 (the first guide section 38*a* and the second guide section 38*b*) until the lamp unit 20 (the substrate holding section 34) comes into contact with the wall part 76 provided in the housing 70 (refer to FIG. 6) to cause the plurality of hook parts 78 provided in the housing 70 to engage with the plurality of claw parts 34*c* provided in the lamp unit 20. Accordingly, the lamp unit 20 is positioned with respect to the housing 70 and, at the same time, fixed to the housing 70 in a state where the first electrode 54 and the second electrode 82 are electrically connected (FIG. 6). The plurality of claw parts 34*c* and the plurality of hook parts 78 represent an example of the first fixing means according to the present invention.

In this manner, the organic EL panel 40 (the first electrode 54) and the second electrode 82 (the power feeding section) can be electrically connected by simply (at the same time as) fixing the lamp unit 20 (the organic EL panel 40) to the housing 70 without having to perform work for connecting the organic EL panel 40 (the first electrode 54) and the second electrode 82 (the power feeding section).

The lamp unit 20 can be detached from the housing 70 by releasing the engagement of the plurality of hook parts 78 with respect to the plurality of claw parts 34*c* and reversing the procedure described above.

Therefore, for example, when the lamp unit 20 fails, the failed lamp unit 20 can be readily detached from the housing 70. In addition, an unfailed lamp unit 20 can be readily mounted to the housing 70 in place of the failed lamp unit 20.

As described above, according to the present embodiment, the vehicle lamp 10 which enables work for connecting the organic EL panel 40 (the first electrode 54) and the second electrode 82 (the power feeding section) of the main circuit board 80 to be omitted can be provided.

This is attributable to the fact that, since the housing 70 includes the second electrode 82 to which the first electrode 54 of the lamp unit 20 fixed to the housing 70 is to be electrically connected, the organic EL panel 40 (the first electrode 54) and the second electrode 82 (the power feeding section) can be electrically connected by simply (at the same time as) fixing the lamp unit 20 (the organic EL panel 40) to the housing 70 without having to perform work for connecting the organic EL panel 40 (the first electrode 54) and the second electrode 82 (the power feeding section).

In addition, according to the present embodiment, when a given lamp unit 20 fails, the failed lamp unit 20 can be detached from the housing 70 and an unfailed lamp unit 20 can be mounted to the housing 70. In other words, the lamp unit 20 can be partially replaced.

Next, modifications will be described.

While an example in which the vehicle lamp according to the present invention is applied to a tail lamp has been described in the embodiment presented above, the vehicle lamp is not limited to a tail lamp. For example, the vehicle lamp according to the present invention may also be applied to position lamps other than a tail lamp, a stop lamp, a turn signal, a side marker lamp, and a vehicle front lamp. In addition, a rear combination lamp including a tail lamp, a stop lamp, and a turn signal can be constructed by applying the vehicle lamp according to the present invention.

In addition, while an example in which the plurality of claw parts 34*c* and the plurality of hook parts 78 are used as the first fixing means which fixes the lamp unit 20 and the housing 70 has been described in the embodiment presented above, the first fixing means is not limited thereto.

For example, a screw or other fixing means may be used as the first fixing means which fixes the lamp unit 20 and the housing 70.

Furthermore, while an example in which the plurality of claw parts 34*c* are provided in the lamp unit 20 and the plurality of hook parts 78 are provided in the housing 70 has been described in the embodiment presented above, this configuration is not restrictive. For example, the plurality of claw parts 34*c* may be provided in the housing 70 and the plurality of hook parts 78 may be provided in the lamp unit 20.

In addition, while an example in which the plurality of claw parts 32*c* and the plurality of hook parts 66 are used as the second fixing means which fixes the first bracket 30 and the second bracket 60 has been described in the embodiment presented above, the second fixing means is not limited thereto.

For example, a screw, an adhesive, or other fixing means may be used as the second fixing means which fixes the first bracket 30 and the second bracket 60.

Furthermore, while an example in which the plurality of claw parts 32*c* are provided in the first bracket 30 and the plurality of hook parts 66 are provided in the second bracket 60 has been described in the embodiment presented above, this configuration is not restrictive. For example, the plurality of claw parts 32*c* may be provided in the second bracket 60 and the plurality of hook parts 66 may be provided in the first bracket 30.

In addition, while an example in which the organic EL panel holding section 32 is arranged parallel to the YZ plane and the substrate holding section 34 is arranged parallel to the XY plane has been described in the embodiment presented above, arrangements are not limited thereto.

Figure 8:
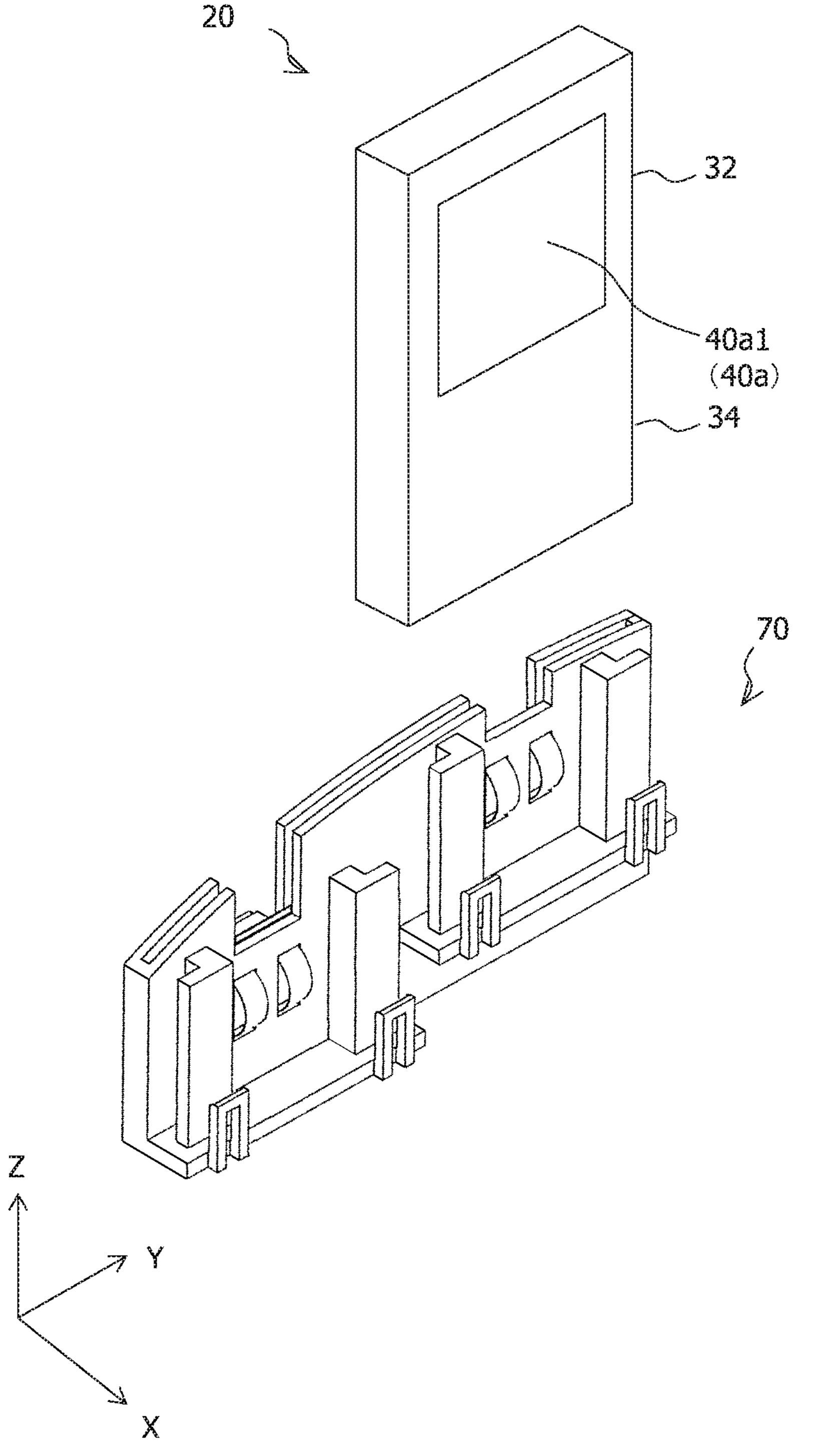
FIG. 8 is a perspective view of the vehicle lamp 10 (modification).

For example, as illustrated in FIG. 8, both the organic EL panel holding section 32 and the substrate holding section 34 may be arranged parallel to the YZ plane.

Furthermore, while an example in which the guide section 38 (refer to FIG. 4) is provided in the lamp unit 20 and the flange part 74 (refer to FIG. 7) is provided in the housing 70 has been described in the embodiment presented above, this configuration is not restrictive. For example, the guide section 38 may be provided in the housing 70 and the flange part 74 may be provided in the lamp unit 20.

In addition, while an example in which a resistor is provided on the sub-circuit board 50 has been described in the embodiment presented above, this configuration is not restrictive. For example, a resistor may be provided on the main circuit board 80 or between the sub-circuit board 50 and the main circuit board 80.

Furthermore, while an example in which a planar wiring pattern is used as the first electrode 54 of the sub-circuit board 50 and a spring electrode is used as the second electrode 82 of the main circuit board 80 has been described in the embodiment presented above, this configuration is not restrictive. For example, a spring electrode may be used as the first electrode 54 of the sub-circuit board 50 and a planar wiring pattern may be used as the second electrode 82 of the main circuit board 80.

The respective numerical values presented in the respective embodiments described above are by way of example only and, obviously, different appropriate numerical values can be used.

The respective embodiments described above are to be considered in all respects as illustrative and not restrictive. The present invention is not to be taken in a limited sense based on the description of the respective embodiments presented above. The present invention may be embodied in various other forms without departing from the spirit or primary characteristics thereof.

What is claimed is:

1. A vehicle lamp comprising:

a lamp unit;

a mounting section to which the lamp unit is detachably mounted; and first fixing means which fixes the lamp unit detachably mounted to the mounting section, and the mounting section, wherein the lamp unit includes:

an organic EL panel including a front surface with a light-emitting surface, and a rear surface on an opposite side to the front surface;

a substrate physically separated from the organic EL panel;

a brightness adjusting resistor mounted on the substrate;

a first electrode mounted on the substrate;

and a first bracket which includes a first holding section for holding the organic EL panel and a second holding section for holding the substrate, and the mounting section includes a second electrode, the organic EL panel and the first electrode are electrically connected to the brightness adjusting resistor, the first electrode is electrically connected to the second electrode in a state where the lamp unit is mounted on the mounting section by the first fixing means.

2. The vehicle lamp according to claim 1, comprising:

the first bracket arranged on the rear surface of the organic EL panel;

a second bracket arranged on the front surface of the organic EL panel; and second fixing means which fixes the first bracket and the second bracket in a state where the organic EL panel is sandwiched between the first bracket and the second bracket.

3. The vehicle lamp according to claim 2, wherein the first holding section extends in a first direction, and the second holding section extends in a second direction which intersects with the first direction.

4. The vehicle lamp according to claim 3, wherein the second holding section is provided with a substrate housing section which houses the substrate, and the second bracket is provided with a substrate pressing section which presses the substrate housed in the substrate housing section in a state where the first bracket and the second bracket are fixed by the second fixing means.

5. The vehicle lamp according to claim 2, wherein the second holding section is provided with a substrate housing section which houses the substrate, and the second bracket is provided with a substrate pressing section which presses the substrate housed in the substrate housing section in a state where the first bracket and the second bracket are fixed by the second fixing means.

6. The vehicle lamp according to claim 1, wherein the substrate is detachably mounted to the second holding section.

7. The vehicle lamp according to claim 6, wherein the organic EL panel includes a feeder cable which includes a first connection portion, the substrate includes a second connection portion mounted on the substrate, the second connection portion is electrically connected to the brightness adjusting resistor, the organic EL panel is electrically connected to the brightness adjusting resistor by electrically connecting the first connection portion and the second connection portion.

8. The vehicle lamp according to claim 7, wherein one of the first electrode and the second electrode is a planar electrode, and the other is a spring electrode.

9. The vehicle lamp according to claim 7, wherein the first connection portion is a plug;

the second connection portion is a connector into which the plug is inserted.

* * * * *